(12) United States Patent
Lin et al.

(10) Patent No.: US 10,164,003 B2
(45) Date of Patent: Dec. 25, 2018

(54) MIM CAPACITOR AND METHOD OF FORMING THE SAME

(71) Applicant: TAIWAN SEMICONDUCTOR MANUFACTURING COMPANY LTD., Hsinchu (TW)

(72) Inventors: Hsing-Lien Lin, Hsinchu (TW); Hai-Dang Trinh, Hsinchu (TW); Cheng-Yuan Tsai, Hsin-Chu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/137,553

(22) Filed: Apr. 25, 2016

(65) Prior Publication Data

US 2017/0207299 A1 Jul. 20, 2017

Related U.S. Application Data

(60) Provisional application No. 62/278,685, filed on Jan. 14, 2016.

(51) Int. Cl.
*H01L 49/02* (2006.01)
*H01L 21/768* (2006.01)
*H01L 21/8256* (2006.01)

(52) U.S. Cl.
CPC ........ *H01L 28/60* (2013.01); *H01L 21/76895* (2013.01); *H01L 21/8256* (2013.01)

(58) Field of Classification Search
CPC .... H01L 28/60; H01L 21/02175; H01L 28/56
See application file for complete search history.

(56) References Cited

U.S. PATENT DOCUMENTS

| 6,617,206 | B1* | 9/2003 | Sandhu | H01L 21/31654 257/E21.01 |
|---|---|---|---|---|
| 2004/0061157 | A1* | 4/2004 | Kiyotoshi | H01L 28/75 257/296 |
| 2005/0087790 | A1* | 4/2005 | Dornisch | H01L 28/40 257/310 |
| 2007/0190718 | A1* | 8/2007 | Coolbaugh | H01L 21/76808 438/253 |
| 2008/0160712 | A1* | 7/2008 | Park | H01G 4/10 438/381 |
| 2014/0313638 | A1* | 10/2014 | Kato | H01G 9/07 361/524 |

(Continued)

*Primary Examiner* — Wael Fahmy
*Assistant Examiner* — Sarah Salerno
(74) *Attorney, Agent, or Firm* — WPAT, P.C., Intellectual Property Attorneys; Anthony King (57) ABSTRACT

A method of forming a metal-insulator-metal capacitor is provided. The method includes forming a first metal plate over a semiconductor substrate, forming a first dielectric layer with a first dielectric constant on a surface of the first metal plate, forming a second dielectric layer with a second dielectric constant on a surface of the first dielectric layer, forming a third dielectric layer with a third dielectric constant on a surface of the second dielectric layer, and forming a second metal plate on a surface of the third dielectric layer. The second dielectric constant is different from the first dielectric constant and different from the third dielectric constant.

20 Claims, 11 Drawing Sheets

(56) References Cited

U.S. PATENT DOCUMENTS

2015/0170837 A1* 6/2015 Madhukar .............. H01G 4/008
  361/313
2015/0279922 A1* 10/2015 Chang .................... H01L 28/60
  257/532

* cited by examiner

MIM CAPACITOR AND METHOD OF FORMING THE SAME

CROSS-REFERENCE TO RELATED APPLICATION

This application claims the benefit of U.S. Provisional Application No. 62/278,685, filed Jan. 14, 2016.

BACKGROUND

Integrated chips comprise millions or billions of transistor devices, which are configured to act as switches and/or to produce power gains so as to enable logical functionality for an integrated chip (e.g., to form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide an integrated chip with a wide range of different functionalities (e.g., manufacturing analog and digital circuitry on a same die). MIM (metal-insulator-metal) capacitors are a particular type of capacitor, having a top metal plate and a bottom metal plate separated by an insulating material, which are often integrated into the back-end-of-the-line metal interconnect layers of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

MIM (metal-insulator-metal) capacitors are a particular type of capacitor, having a top metal plate and a bottom metal plate separated by a capacitor dielectric layer, which are often implemented into the back-end-of-the line (BEOL) metal interconnect layers of integrated circuits. As MIM capacitor is scaled down in advanced semiconductor manufacturing technology, the reliability of the capacitor dielectric layer becomes a major issue of the MIM capacitor. For example, when the size of MIM capacitor is scaled down to about 10 nm, the high-k (high dielectric constant) material (e.g., Hafnium oxide ($HfO_2$)) used in the capacitor dielectric layer may easily crystallize at high temperature. The crystalline dielectric layer may induce leakage current between the top metal plate and the bottom metal plate. As a result, the time dependent dielectric breakdown (TDDB) of the MIM capacitor may not meet the target of 10 years/125° C. even though $HfO_2$ has a relatively high capacitance density in the range of about 28-30 Ff/um².

Figure 1:
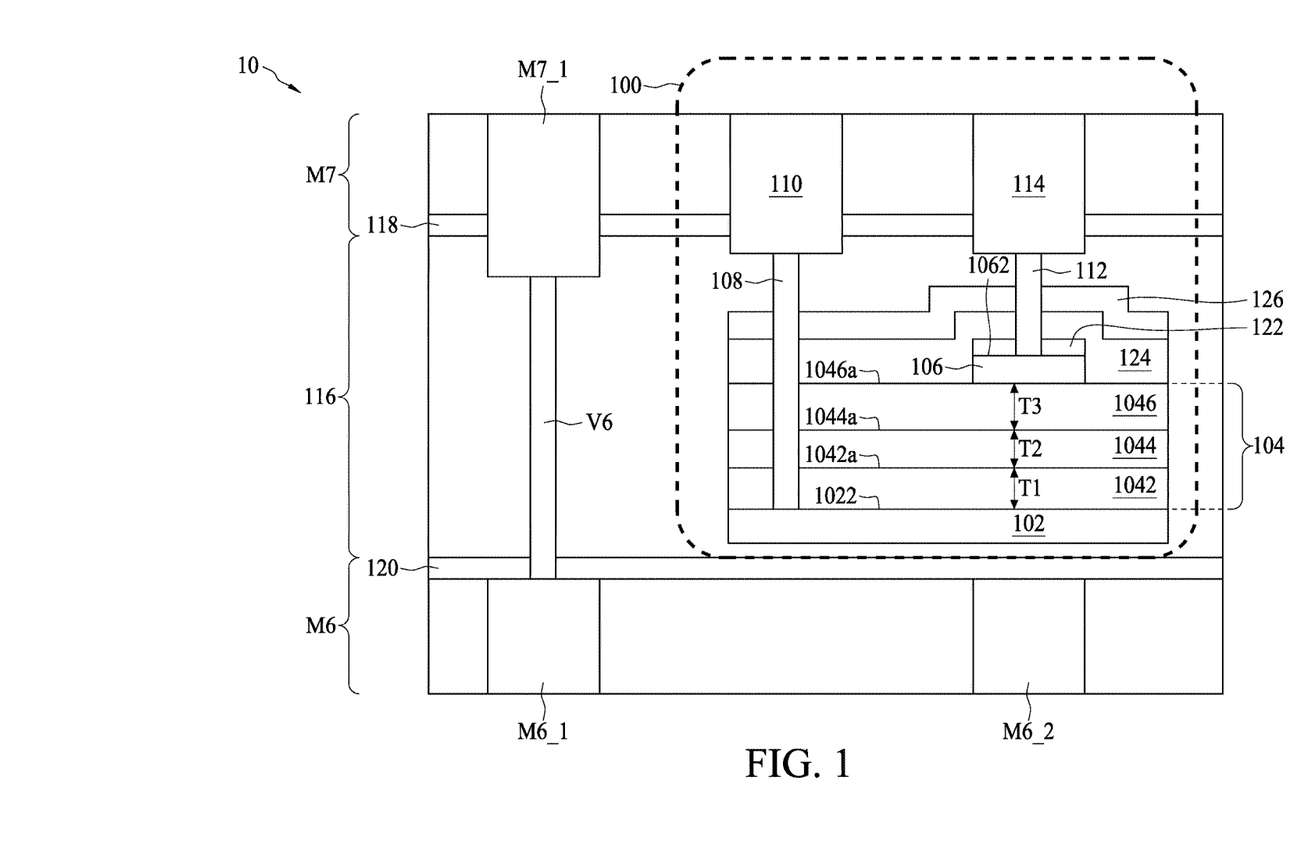
FIG. 1 is a diagram illustrating a cross-sectional view of an MIM capacitor according to some embodiments.

Accordingly, the present disclosure provides a capacitive device having a novel dielectric structure with high crystalline temperature and high dielectric constant for improving the TDDB of the capacitive device. Also, the present disclosure provides an associated method of forming the capacitive device. The capacitive device may be an MIM (metal-insulator-metal) capacitor or an MIM decoupling capacitor. FIG. 1 is a diagram illustrating a cross-sectional view of an MIM capacitor 100 according to some embodiments. The MIM capacitor 100 is disposed between two metal layers in the metal layer structure or back end of line (BEOL) of an integrated circuit 10. For illustration purpose, the first metal layer is the seventh metal layer M7 (i.e., the top metal layer) in the metal layer structure, and the second metal layer is the sixth metal layer M6 (i.e., the second highest metal layer) in the metal layer structure. This is not a limitation of the present disclosure. The MIM capacitor 100 comprises a first metal plate 102, a plurality of dielectric layers 104, and a second metal plate 106. The plurality of dielectric layers 104 is disposed between the first metal plate 102 and the second metal plate 106. According to some embodiments, the plurality of dielectric layers 104 is disposed over a surface 1022 of the first metal plate 102. The plurality of dielectric layers 104 comprises at least a dielectric layer doped with tantalum (Ta). According to some embodiments, the plurality of dielectric layers 104 comprises a first dielectric layer 1042, a second dielectric layer 1044, and a third dielectric layer 1046. The second dielectric layer 1044 is sandwiched between the first dielectric layer 1042 and the third dielectric layer 1046. The second metal plater 106 is disposed over a surface 1046a of the third dielectric layer 1046.

According to some embodiments, a first metal via structure 108 is arranged to connect the first metal plate 102 to a first top metal line 110. A second metal via structure 112 is arranged to connect the second metal plate 106 to a second top metal line 114. The first metal via structure 108 is connected to the surface 1022 of the first metal plate 102. The second metal via structure 112 is connected to the surface 1062 of the second metal plate 106. According to some embodiments, the first metal plate 102 is the bottom metal plate of the MIM capacitor 100, and the second metal plate 106 is the top metal plate of the MIM capacitor 100. In addition, an interlayer dielectric (ILD) layer 116 is disposed between the sixth metal layer M6 and the seventh metal layer M7. Therefore, the MIM capacitor 100, the first metal via structure 108, and the second metal via structure 112 are disposed in the ILD layer 116. The ILD layer 116 may be an oxide layer, a low-k dielectric layer, or an ultra low-k dielectric layer. For example, the dielectric constant of the ILD layer 166 is lower than the dielectric constants of the plurality of dielectric layers 104. An etch stop layer 118 is disposed between the seventh metal layer M7 and the ILD layer 116. An interface layer 120 is disposed between the ILD layer 116 and the sixth metal layer M6.

In addition, according to some embodiments, a masking layer 122 is disposed over the second metal plate 106. A capping layer 124 is disposed over the masking layer 122 and the third dielectric layer 1046. An etch stop layer 126 is disposed over the capping layer 124. The first metal via structure 108 is arranged to pass through the etch stop layer 126, the capping layer 124, and the dielectric layers 1046, 1044, 1042 to connect the first metal plate 102. The second metal via structure 112 is arranged to pass through the etch stop layer 126, the capping layer 124, and the masking layer 122 to connect the second metal plate 106. In addition, a top metal line M7_1, two second highest metal lines M6_1, M6_2 and a via structure V6 are also shown in FIG. 1, wherein the via structure V6 is electrically connected to the top metal line M7_1 and the second highest metal line M6_1.

According to some embodiments, the thickness T1 of the first dielectric layer 1042 is substantially equal to the thickness T3 of the third dielectric layer 1046, and the thickness T2 of the second dielectric layer 1044 is smaller than the thickness T1 of the first dielectric layer 1042 and smaller than the thickness T3 of the third dielectric layer 1046. Moreover, the area of the second dielectric layer 1044 is not smaller than the area of the first dielectric layer 1044 or the area of the third dielectric layer 1046. For example, the area of the second dielectric layer 1044 is larger than the area of the first dielectric layer 1044 and larger than the area of the third dielectric layer 1046 such that the first dielectric layer 1042 and the third dielectric layer 1046 are separated by the second dielectric layer 1044. In other words, the first dielectric layer 1042 does not physically contact the third dielectric layer 1046.

The plurality of dielectric layers 104 includes a high-k (high dielectric constant) material. The plurality of dielectric layers 104 may consist of the material of Ta-doped Hafnium oxide (HfO$_2$). According to some embodiments, the first dielectric layer 1042, the second dielectric layer 1044, and the third dielectric layer 1046 are formed by high-k dielectric materials with a first dielectric constant K1, a second dielectric constant K2, and a third dielectric constant K3, respectively. The second dielectric constant K2 is different from the first dielectric constant K1 and the third dielectric constant K3. According to some embodiments, the first dielectric constant K1 is substantially equal to the third dielectric constant K3, and the second dielectric constant K2 is different from but close to the first dielectric constant K1 and the third dielectric constant K3. The second dielectric constant K2 may be smaller or larger than the first dielectric constant K1 and the third dielectric constant K3. For example, the second dielectric constant K2 may be within 30% variation of the first dielectric constant K1 (or the third dielectric constant K3). According to some embodiments, the material of the first dielectric layer 1042 is similar to the material of the third dielectric layer 1046, and the material of the second dielectric layer 1044 is different from the material of the first dielectric layer 1042 and the material of the third dielectric layer 1046. According to some embodiments, the first dielectric layer 1042 and the third dielectric layer 1046 comprise material selected from the group consisting of Hafnium oxide (HfO$_2$), Zirconium dioxide (ZrO$_2$), Lanthanum oxide (La$_2$O$_3$), and Titanium Dioxide (TiO$_2$), and the second dielectric layer 1044 comprises Tantalum pentoxide (Ta$_2$O$_5$). For example, when the materials of the first dielectric layer 1042 and the third dielectric layer 1046 are HfO$_2$ and the material of the second dielectric layer 1044 is Ta$_2$O$_5$, the plurality of dielectric layers 104 can be regarded as a Ta-doped HfO$_2$ layer, wherein the dielectric constant of HfO$_2$ is about 25, and the dielectric constant of Ta$_2$O$_5$ is about 24.

Moreover, the first dielectric layer 1042 has a first crystalline temperature Ta, the second dielectric layer 1044 has a second crystalline temperature Tb, and the third dielectric layer 1046 has a third crystalline temperature Tc. According to some embodiments, the second crystalline temperature Tb is higher than the first crystalline temperature Ta and higher than the third crystalline temperature Tc. For example, when the material of the first dielectric layer 1042 and the material of the third dielectric layer 1046 are HfO$_2$ and the material of the second dielectric layer 1044 is Ta$_2$O$_5$, the crystalline temperature Tb of the second dielectric layer 1044 is about 700° C., and the crystalline temperature Ta (or Tc) of the first dielectric layer 1042 (or the third dielectric layer 1046) is about 250° C. The crystalline temperature of a dielectric layer may be the threshold temperature of the dielectric layer to transit from amorphous state into crystalline state. When the temperature is higher than the crystalline temperature, the dielectric layer transits to the crystalline state from the amorphous state. Crystallization in the dielectric layer may render the dielectric layer electrical conductive. That is, when a dielectric material is crystallized, the dielectric material transits into the electrical conductive material from the insulating material. Accordingly, when the second crystalline temperature Tb is higher than the first crystalline temperature Ta and higher than the third crystalline temperature Tc, the crystalline effect is more easy to occur in the first dielectric layer 1042 and the third dielectric layer 1046 than the second dielectric layer 1044 in a high temperature environment, e.g., 400° C. As a result, the second dielectric layer 1044 is kept at an amorphous state when the first dielectric layer 1042 and the third dielectric layer 1046 are crystallized in the high temperature environment. When the second dielectric layer 1044 is kept at an amorphous state, the plurality of dielectric layers 104 may still be an insulating layer between the first metal plate 102 and the second metal plate 106 even though the first dielectric layer 1042 and the third dielectric layer 1046 are crystallized. Accordingly, the TDDB of the MIM capacitor 100 can meet the target of, for example, 10 years/125° C. during the thermal budget evaluation process.

In addition, the first dielectric layer 1042 has a first bandgap energy Ga, the second dielectric layer 1044 has a second bandgap energy Gb, and the third dielectric layer 1046 has a third bandgap energy Gc. The second bandgap energy Gb may be within 30% variation of the first bandgap energy Ga (or the third bandgap energy Gc). For example, when the material of the first dielectric layer 1042 and the material of the third dielectric layer 1046 are $HfO_2$ and the material of the second dielectric layer 1044 is $Ta_2O_5$, the first bandgap energy Ga and the third bandgap energy Gc are about 5.6 eV, and the second bandgap energy Gb is about 4 eV. The bandgap energy of a dielectric layer may be the threshold energy of an electron to leap over the dielectric layer. In an MIM capacitor, when the energy of an electron is higher than the bandgap energy of the dielectric layer between the top metal plate and the bottom metal plate, the electron leaps over the dielectric layer to reach the bottom metal plate from the top metal plate, or vice versa. As a result, a conductive path is formed between the top metal plate and the bottom metal plate, and the MIM capacitor may thus fail. Among the plurality of dielectric layers 104 having different bandgap energies, a dielectric layer with the highest bandgap may dominate the bandgap energy of the plurality of dielectric layers 104. According to some embodiments, the first bandgap energy Ga and the third bandgap energy Gc are higher than the second bandgap energy Gb, thus the first bandgap energy Ga and the third bandgap energy Gc are the dominating bandgap energy for an electron to leap over the plurality of dielectric layers 104. Therefore, the breakdown voltage (e.g., higher than 4.1 V) of the MIM capacitor 100 is increased in comparison with the counterpart of MIM capacitor only using a dielectric layer with pure $HfO_2$. The leakage current (e.g., lower than $10^{-12}$ A/um$^2$) of the MIM capacitor 100 is decreased due to the good insulating property of the plurality of dielectric layers 104.

Accordingly, when the plurality of dielectric layers 104 is Ta-doped $HfO_2$ layers, the capacitance density (e.g., about 28.4 Ff/um$^2$) of the MIM capacitor 100 is increased without compromise in leakage and reliability performance because $HfO_2$ has a relatively high bandgap energy (e.g., 5.6 eV) and $Ta_2O_5$ has a relatively high crystallization resistance.

Figure 2:
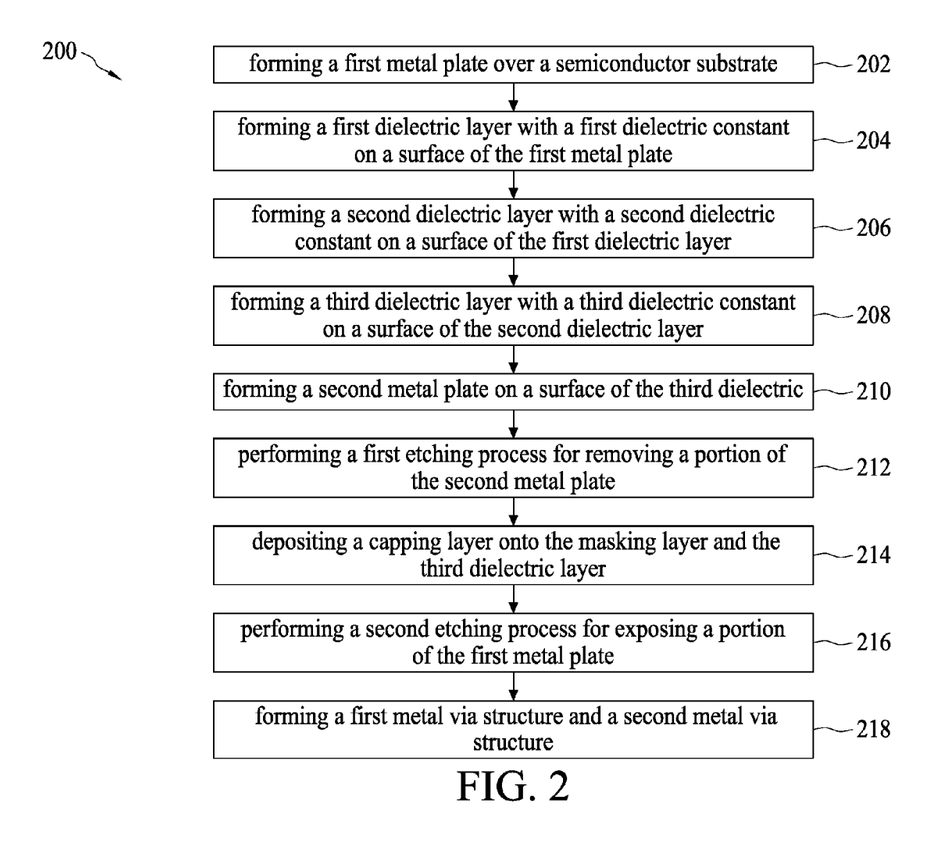
FIG. 2 is a flowchart illustrating a method of forming an MIM capacitor according to some embodiments.

FIG. 2 is a flowchart illustrating a method 200 of forming a capacitive device according to some embodiments. The capacitive device may be an MIM capacitor, such as the MIM capacitor 100. FIG. 3 to FIG. 11 are cross-sectional views of the MIM capacitor fabricated at various stages, in accordance with some embodiments of the present disclosure. While the disclosed method 200 is illustrated and described below as a series of operations or events, it will be appreciated that the illustrated ordering of such operations or events are not to be interpreted in a limiting sense. For example, some operations may occur in different orders and/or concurrently with other operations or events apart from those illustrated and/or described herein. In addition, not all illustrated acts may be required to implement one or more aspects or embodiments of the description herein. Further, one or more of the operations depicted herein may be carried out in one or more separate operations and/or phases.

Figure 3:
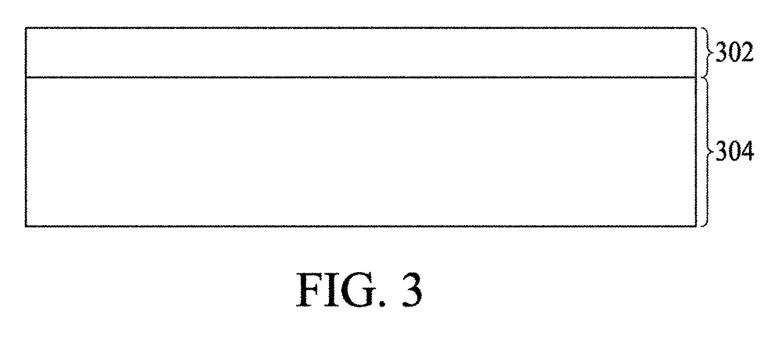
FIG. 3 to FIG. 11 are cross-sectional views of an MIM capacitor fabricated at various stages, in accordance with some embodiments of the present disclosure.

In operation 202 and FIG. 3, a first metal plate 302 is formed over a semiconductor substrate (not shown). The first metal plate 302 is formed on an ILD layer 304 between a first metal layer and a second metal layer of a metal layer structure or BEOL on the semiconductor substrate. According to some embodiments, the first metal plate 302 is formed between the top metal layer (e.g., the seventh metal layer M7) and the second highest metal layer (e.g., the sixth metal layer M6) over the semiconductor substrate. For brevity, FIG. 3 merely shows the first metal plate 302 and the ILD layer 304. The first metal plate 302 may be formed by process of physical vapor deposition (PVD) or chemical vapor deposition (CVD). The first metal plate 302 may comprise titanium nitride (TiN) or tantalum nitride (TaN). The thickness of the first metal plate 302 may be about 400 Å. The first metal plate 302 serves as the capacitor bottom metal of the MIM capacitor.

Figure 4:
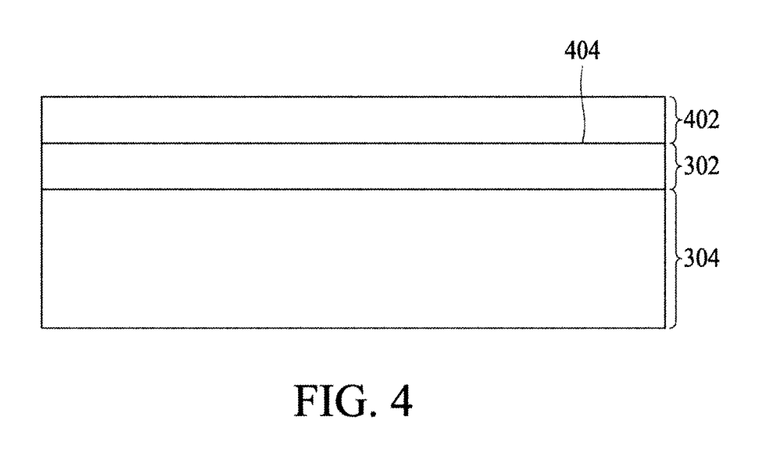

In operation 204 and FIG. 4, a first dielectric layer 402 with a first dielectric constant K1 is formed on a surface 404 of the first metal plate 302. The first dielectric layer 402 may be formed by process of atomic layer deposition (ALD). The first dielectric layer 402 may comprise material selected from the group consisting of Hafnium oxide ($HfO_2$), Zirconium dioxide ($ZrO_2$), Lanthanum oxide ($La_2O_3$), and Titanium Dioxide ($TiO_2$). The thickness of the first dielectric layer 402 may be about 25~35 Å. The crystalline temperature of the first dielectric layer 402 is the first crystalline temperature Ta. The first dielectric layer 402 has a first bandgap energy Ga.

Figure 5:
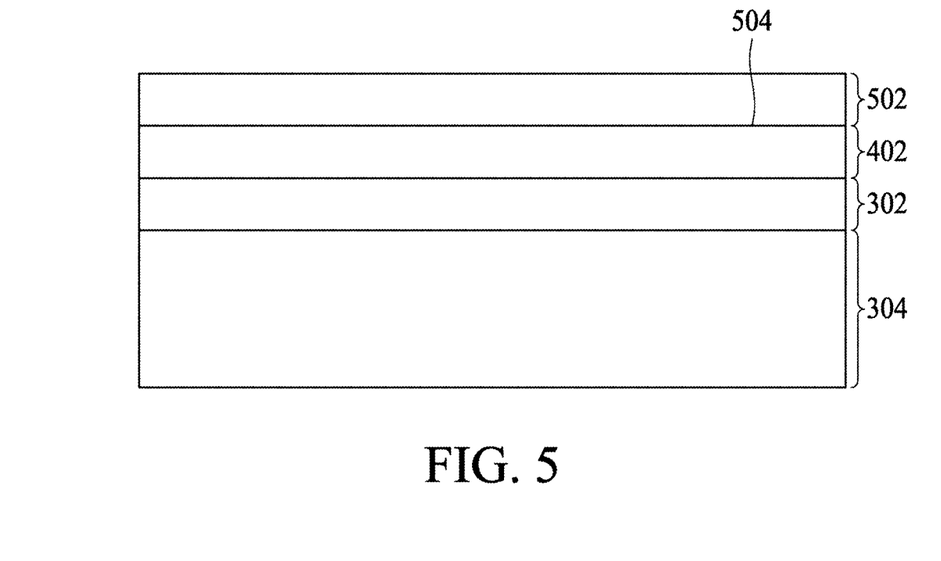

In operation 206 and FIG. 5, a second dielectric layer 502 with a second dielectric constant K2 is formed on a surface 504 of the first dielectric layer 402. The second dielectric layer 502 may be formed by process of atomic layer deposition (ALD). The second dielectric layer 502 may comprise Tantalum pentoxide ($Ta_2O_5$). The thickness of the second dielectric layer 502 may be about 5~10 Å. The crystalline temperature of the second dielectric layer 502 is the second crystalline temperature Tb. The second dielectric layer 502 has a second bandgap energy Gb.

Figure 6:
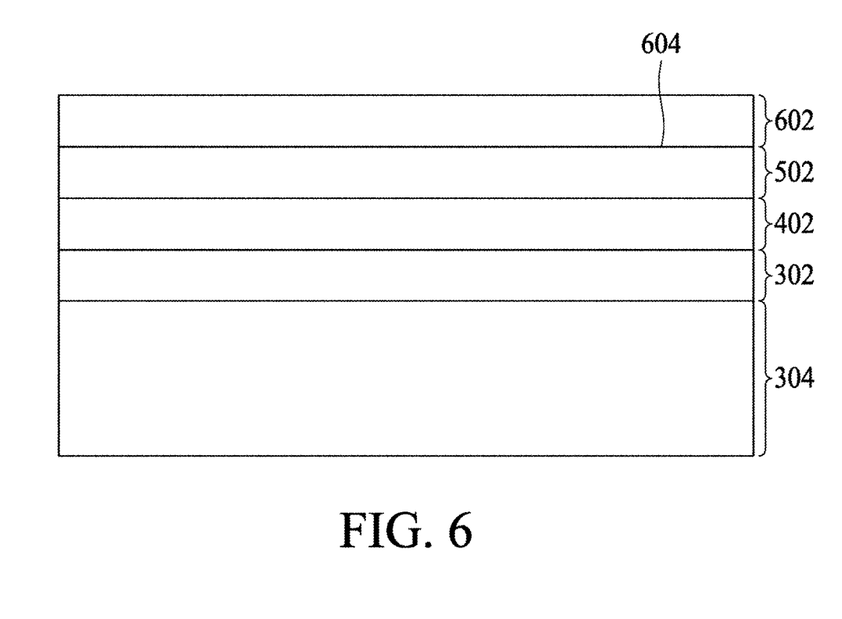

In operation 208 and FIG. 6, a third dielectric layer 602 with a third dielectric constant K3 is formed on a surface 604 of the second dielectric layer 502. The third dielectric layer 602 may be formed by process of atomic layer deposition (ALD). The third dielectric layer 602 may comprise material selected from the group consisting of Hafnium oxide ($HfO_2$), Zirconium dioxide ($ZrO_2$), Lanthanum oxide ($La_2O_3$), and Titanium Dioxide ($TiO_2$). The thickness of the third dielectric layer 602 may be about 25~35 Å. The crystalline temperature of the third dielectric layer 602 is the third crystalline temperature Tc. The third dielectric layer 602 has a third bandgap energy Gc.

The second dielectric layer 502 is sandwiched between the first dielectric layer 402 and the third dielectric layer 602. According to some embodiments, the first dielectric layer 402 and the third dielectric layer 602 are $HfO_2$, and the second dielectric layer 502 is $Ta_2O_5$. Therefore, the first dielectric constant K1 is substantially equal to the third dielectric constant K3 (e.g., about 25), and the second dielectric constant K2 (e.g., about 25) is different from but close to the first dielectric constant K1 and the third dielectric constant K3. Moreover, the first crystalline temperature Ta is substantially equal to the third crystalline temperature Tc (e.g., about 250° C.). The second crystalline temperature Tb (e.g., about 700° C.) is higher than the first crystalline temperature Ta and the third crystalline temperature Tc. The first bandgap energy Ga is substantially equal to the third bandgap energy Gc (e.g., about 5.6 eV). The second bandgap energy Gb (e.g., about 4 eV) is different from but close to the first bandgap energy Ga and the third bandgap energy Gc.

Figure 7:
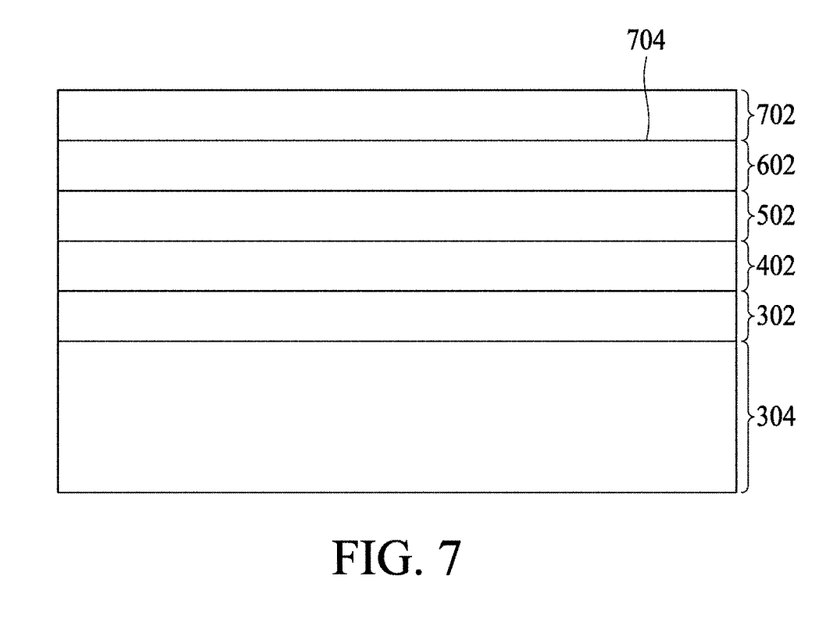

In operation 210 and FIG. 7, a second metal plate 702 is formed on a surface 704 of the third dielectric layer 602. The second metal plate 702 may be formed by process of physical vapor deposition (PVD) or chemical vapor deposition (CVD). The second metal plate 702 may comprise titanium nitride (TiN) or tantalum nitride (TaN). The second metal plate 702 is thicker than the first metal plate 302. For example, the thickness of the second metal plate 702 may be about 600 Å. The second metal plate 702 serves as the capacitor top metal of the MIM capacitor.

Figure 8:
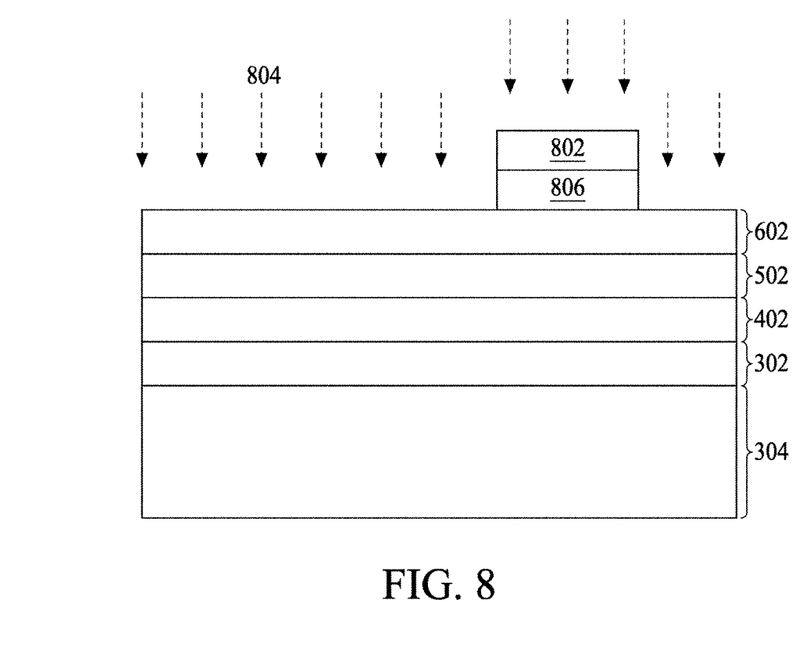

In operation 212 and FIG. 8, a patterned conductive layer 806 is formed by removing a portion of the second metal plate 702 in, for example, a first etching process. The patterned conductive layer 806 serves as a first metal plate for the MIM capacitor. Accordingly, a top metal plate 806 of the MIM capacitor is formed. During the first etching process, a masking layer 802 may be formed over a portion of the second metal plate 702 to define a top electrode of the MIM capacitor. According to some embodiments, the masking layer 802 may comprise a hard mask material. For example, the masking layer 802 may comprise a protective silicon oxy-nitride (PE-SiON) layer deposited by a plasma enhanced chemical vapor deposition technique.

The first etching process is subsequently performed by selectively exposing the second metal plate 702 to an etchant 804 in areas not covered by the masking layer 802. The etchant 804 defines a top electrode by removing unmasked areas of the second metal plate 702. In some embodiments, the etchant 804 may comprise a dry etchant (e.g., a plasma etchant, an RIE etchant, etc.).

Figure 9:
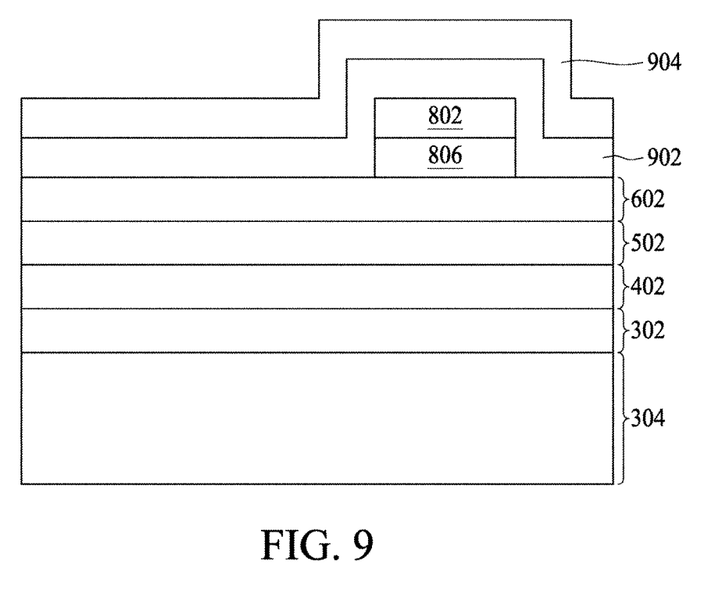

In operation 214 and FIG. 9, a capping layer 902 is deposited onto the masking layer 802 and the third dielectric layer 602. According to some embodiments, the capping layer 902 may comprise oxide, for example. Moreover, an etch stop layer 904 is deposited onto the capping layer 902. According to some embodiments, the etch stop layer 904 may comprise silicon nitride (SiN), for example. In some embodiments, the capping layer 902 and the etch stop layer 904 may be deposited by the process of vapor deposition (e.g., physical vapor deposition, chemical vapor deposition, etc.)

Figure 10:
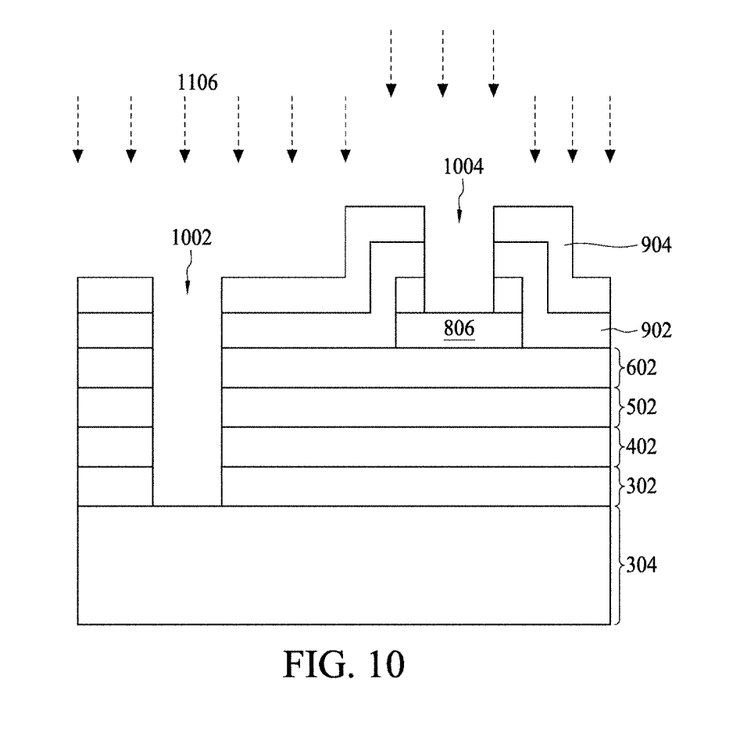

In operation 216 and FIG. 10, a second etching process is performed. The second etching process is arranged to etch a portion of the etch stop layer 904, the capping layer 902, the third dielectric layer 602, the second dielectric layer 502, and the third dielectric layer 402 to form a first trench 1002 for exposing a portion of the first metal plate 302. The first metal plate 302 is the above mentioned first metal plate 102 of the MIM capacitor. In addition, the second etching process is also arranged to etch another portion of the etch stop layer 904, the capping layer 902, and the masking layer 802 to form a second trench 1004 for exposing a portion of the top metal plate 806. The second etching process is performed by selectively exposing the etch stop layer 904, the capping layer 902, the third dielectric layer 602, the second dielectric layer 502, and the third dielectric layer 402 to an etchant 1006. In some embodiments, the etchant 1006 may comprise a dry etchant (e.g., a plasma etchant, an RIE etchant, etc.).

Figure 11:
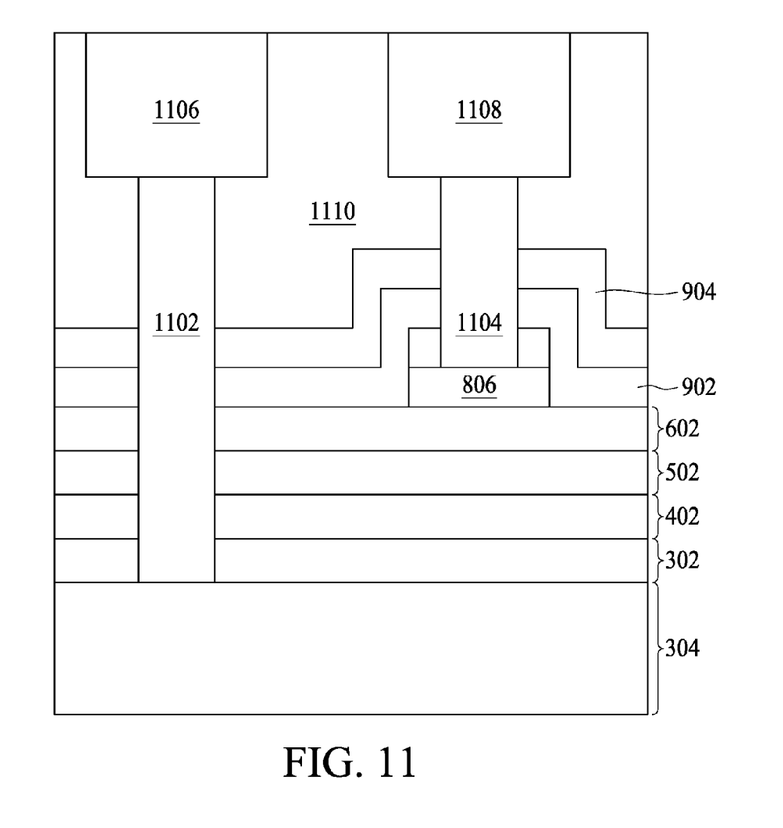

In operation 218 and FIG. 11, a first metal via structure 1102 and a second metal via structure 1104 is formed to electrically connect the first metal plate 302 and the top metal plate 806, respectively. The first metal via structure 1102 and the second metal via structure 1104 are electrically connected to a first top metal line 1106 and a second top metal line 1108, respectively. An ILD layer 1110 may be disposed over the etch stop layer 904 to surround the first metal via structure 1102, the second metal via structure 1104, the first top metal line 1106, and the second top metal line 1108.

Accordingly, the MIM capacitor having the plurality of stacked high-k dielectric layers 402, 502, 602 is formed. The first dielectric layer 402 and the third dielectric layer 602 are $HfO_2$. The second dielectric layer 502 is $Ta_2O_5$. The second dielectric layer 502 is sandwiched between the first dielectric layer 402 and the third dielectric layer 602. The second crystalline temperature Tb of the second dielectric layer 502 is higher than the first crystalline temperature Ta of the first dielectric layer 402 and the third crystalline temperature Tc of the third dielectric layer 602. The second dielectric layer 502 is kept at an amorphous state when the first dielectric layer 402 and the third dielectric layer 602 are crystallized in the high temperature environment. Therefore, the top metal plate 806 is insulated from the bottom metal plate 302 of the MIM capacitor even when the first dielectric layer 402 and the third dielectric layer 602 are crystallized in a high temperature (e.g., 400° C.) environment. Accordingly, the MIM capacitor not only has the high capacitance density property, the TDDB of the MIM capacitor also meets the target of 10 years/125° C.

Some embodiments of the present disclosure provide a method of forming a MIM (metal-insulator-metal) capacitor. The method comprises: forming a first metal plate over a semiconductor substrate; forming a first dielectric layer with a first dielectric constant over a surface of the first metal plate; forming a second dielectric layer with a second dielectric constant over a surface of the first dielectric layer, forming a third dielectric layer with a third dielectric constant over a surface of the second dielectric layer, and forming a second metal plate over a surface of the third dielectric layer. The second dielectric constant is different from the first dielectric constant and the third dielectric constant.

Some embodiments of the present disclosure provide a method of forming a capacitive device. The method comprises: forming a first metal plate; forming a plurality of dielectric layers over the first metal plate; and forming a second metal plate over the plurality of dielectric layers. The plurality of dielectric layers comprises at least a dielectric layer doped with tantalum (Ta).

Some embodiments of the present disclosure provide a capacitive device. The capacitive device comprises a first metal plate, a first dielectric layer, a second dielectric layer, a third dielectric layer, and a second metal plate. The first dielectric layer is disposed over the first metal plate. The second dielectric layer is disposed over the first dielectric layer. The third dielectric layer is disposed over the second dielectric layer. The second metal plate is disposed over the third dielectric layer. The first dielectric layer has a first dielectric constant, the second dielectric layer has a second dielectric constant, and the third dielectric layer has a third dielectric constant, the second dielectric constant is different from the first dielectric constant and the third dielectric constant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a metal-insulator-metal (MIM) capacitor, comprising:
   forming a first metal plate over a semiconductor substrate;
   forming a first dielectric layer with a first dielectric constant on the first metal plate;
   forming a second dielectric layer with a second dielectric constant on the first dielectric layer;
   forming a third dielectric layer with a third dielectric constant on the second dielectric layer; and
   forming a second metal plate on the third dielectric layer,
   wherein the second dielectric constant is different from the first dielectric constant and the third dielectric constant, the second dielectric layer comprises Tantalum pentoxide, a thickness of the second dielectric layer is measured from a top surface of the second dielectric layer and a bottom surface of the second dielectric layer, the top surface is in direct contact with the third dielectric layer, the bottom surface is in direct contact with the first dielectric layer, and the thickness of the second dielectric layer is smaller than a thickness of the first dielectric layer and smaller than a thickness of the third dielectric layer.

2. The method of claim 1, further comprising:
   performing a first etching process to remove a portion of the second metal plate;
   performing a second etching process to remove a portion of the first dielectric layer, a portion of the second dielectric layer, and a portion of the third dielectric layer, exposing a portion of the first metal plate;
   forming a first via contacting the first metal plate; and
   forming a second via contacting the second metal plate;
   wherein the first via and the second via are coupled to a first conductive line and a second conductive line, respectively, and the first conductive line and the second conductive line are on the same layer.

3. The method of claim 1, wherein the first dielectric constant is substantially equal to the third dielectric constant, and the second dielectric constant is smaller than the first dielectric constant and smaller than the third dielectric constant.

4. The method of claim 1, wherein the first dielectric layer has a first crystalline temperature, the second dielectric layer has a second crystalline temperature, and the third dielectric layer has a third crystalline temperature, and the second crystalline temperature is higher than the first crystalline temperature and higher than the third crystalline temperature.

5. The method of claim 1, wherein the first dielectric layer has a first band gap energy, the second dielectric layer has a second band gap energy, and the third dielectric layer has a third band gap energy, and the second band gap energy is different from the first band gap energy and different from the third band gap energy.

6. The method of claim 1, wherein the thickness of the first dielectric layer is substantially equal to the thickness of the third dielectric layer.

7. The method of claim 1, wherein an area of the surface of the second dielectric layer is not smaller than an area of the surface of the first dielectric layer and is not smaller than an area of the surface of the third dielectric layer.

8. The method of claim 1, wherein the first dielectric layer is not directly contacted with the third dielectric layer.

9. A method of forming a capacitive device, comprising:
   forming a first metal plate;
   forming a plurality of dielectric layers on the first metal plate; and
   forming a second metal plate on the plurality of dielectric layers,
   wherein the plurality of dielectric layers comprises a first dielectric layer, a second dielectric layer, and a third dielectric layer, the second dielectric layer is sandwiched between the first dielectric layer and the third dielectric layer, the second dielectric layer comprises Tantalum pentoxide, a thickness of the second dielectric layer is measured from a top surface of the second dielectric layer and a bottom surface of the second dielectric layer, the top surface is in direct contact with the third dielectric layer, the bottom surface is in direct contact with the first dielectric layer, and the thickness of the second dielectric layer is smaller than a thickness of the first dielectric layer and smaller than a thickness of the third dielectric layer.

10. The method of claim 9, wherein the first dielectric layer has a first crystalline temperature, the second dielectric layer has a second crystalline temperature, and the third dielectric layer has a third crystalline temperature, and the first crystalline temperature is higher than the second crystalline temperature and higher than the third crystalline temperature.

11. The method of claim 9, wherein the first dielectric layer is not directly contacted with the third dielectric layer.

12. A capacitive device, comprising:
   a first metal plate;
   a first dielectric layer, disposed on the first metal plate;
   a second dielectric layer, disposed on the first dielectric layer;
   a third dielectric layer, disposed on the second dielectric layer; and
   a second metal plate, disposed on the third dielectric layer;
   wherein the first dielectric layer has a first dielectric constant, the second dielectric layer has a second dielectric constant, and the third dielectric layer has a third dielectric constant, the second dielectric constant is different from the first dielectric constant and the third dielectric constant, the second dielectric layer comprises Tantalum pentoxide, a thickness of the second dielectric layer is measured from a top surface of the second dielectric layer and a bottom surface of the second dielectric layer, the top surface is in direct contact with the third dielectric layer, the bottom surface is in direct contact with the first dielectric layer, and the thickness of the second dielectric layer is smaller than a thickness of the first dielectric layer and smaller than a thickness of the third dielectric layer.

13. The capacitive device of claim 12, wherein the first dielectric constant is substantially equal to the third dielectric constant, and the second dielectric constant is different from the second dielectric constant and different from the third dielectric constant.

14. The capacitive device of claim 12, wherein the first dielectric layer has a first crystalline temperature, the second dielectric layer has a second crystalline temperature, and the third dielectric layer has a third crystalline temperature, and the second crystalline temperature is higher than the first crystalline temperature and higher than the third crystalline temperature.

15. The capacitive device of claim 12, wherein the first dielectric layer has a first band gap energy, the second dielectric layer has a second band gap energy, and the third dielectric layer has a third band gap energy, and the second band gap energy is different from the first band gap energy and different from the third band gap energy.

16. The capacitive device of claim 12, wherein the thickness of the first dielectric layer is substantially equal to the thickness of the third dielectric layer.

17. The capacitive device of claim 12, wherein the first dielectric layer is not directly contacted with the third dielectric layer.

18. The capacitive device of claim 12, further comprising:
a masking layer, disposed over the second metal plate;
a capping layer, disposed over the masking layer and the third dielectric layer; and
an etch stop layer, disposed over the capping layer.

19. The capacitive device of claim 18, further comprising:
a first metal via structure, arranged to pass through the etch stop layer, the capping layer, the third dielectric layer, the second dielectric layer, and the first dielectric layer to connect the first metal plate; and
a second metal via structure, arranged to pass through the etch stop layer, the capping layer, and the masking layer to connect the second metal plate.

20. The capacitive device of claim 19, further comprising:
a first metal line, electrically connected to the first metal via structure;
a second metal line, electrically connected to the second metal via structure;
wherein the first metal line and the second metal line are disposed on a top metal layer.

* * * * *